(12) United States Patent
Nakamura

(10) Patent No.: US 11,285,565 B2
(45) Date of Patent: Mar. 29, 2022

(54) LASER PROCESSING METHOD

(71) Applicant: DISCO CORPORATION, Tokyo (JP)

(72) Inventor: Masaru Nakamura, Tokyo (JP)

(73) Assignee: DISCO CORPORATION, Tokyo (JP)

(*) Notice: Subject to any disclaimer, the term of this patent is extended or adjusted under 35 U.S.C. 154(b) by 362 days.

(21) Appl. No.: 15/961,347

(22) Filed: Apr. 24, 2018

(65) Prior Publication Data

US 2018/0304409 A1    Oct. 25, 2018

(30) Foreign Application Priority Data

Apr. 24, 2017 (JP) .............................. JP2017-085505

(51) Int. Cl.
| | |
|---|---|
| *B23K 26/38* | (2014.01) |
| *B23K 37/04* | (2006.01) |
| *H01L 21/268* | (2006.01) |
| *H01L 21/78* | (2006.01) |
| *H01L 21/67* | (2006.01) |
| *B23K 26/03* | (2006.01) |
| *B23K 26/00* | (2014.01) |
| *B23K 26/06* | (2014.01) |
| *B23K 26/53* | (2014.01) |

(Continued)

(52) U.S. Cl.
CPC .......... *B23K 26/38* (2013.01); *B23K 26/0006* (2013.01); *B23K 26/032* (2013.01); *B23K 26/046* (2013.01); *B23K 26/0665* (2013.01); *B23K 26/0823* (2013.01); *B23K 26/0853* (2013.01); *B23K 26/53* (2015.10); *B23K 37/04* (2013.01); *B23K 37/0408* (2013.01); *H01L 21/268* (2013.01); *H01L 21/67115* (2013.01); *H01L 21/78* (2013.01); *B23K 2101/40* (2018.08); *B23K 2103/56* (2018.08); *H01L 21/67092* (2013.01)

(58) Field of Classification Search
CPC ..... B23K 26/38; B23K 26/53; B23K 26/0006
USPC ........... 219/121.72, 546, 543, 544; 131/329, 131/273; 392/395
See application file for complete search history.

(56) References Cited

U.S. PATENT DOCUMENTS 5,994,668 A * 11/1999 Sugahara ............... B23K 26/08
                                                                219/121.72

FOREIGN PATENT DOCUMENTS

| JP | 2007152355 A | 6/2007 | |
| JP | 2014233731 | * 12/2014 | ............ B23K 26/02 |

OTHER PUBLICATIONS

Machine Tranlsation of JP 2014233731; Feb. 2020 (Year: 2020).*

* cited by examiner

*Primary Examiner* — Tu B Hoang
*Assistant Examiner* — Thomas J Ward
(74) *Attorney, Agent, or Firm* — Greer Burns & Crain Ltd.

(57) ABSTRACT

A wafer held on a chuck table is processed by applying a laser beam to the wafer. The laser processing method includes positioning a height detecting unit in a work area of the wafer where the laser beam is to be applied, relatively moving the chuck table and the height detecting unit along a forward path in an X direction, detecting the height of the upper surface of the wafer along the forward path by using the height detecting unit, and storing height information at plural X coordinates on the forward path into a memory; and relatively moving the chuck table and the height detecting unit along a backward path in the X direction, detecting the height of the upper surface of the wafer along the backward (Continued)

path by using the height detecting unit, and storing height information at plural X coordinates on the backward path into the memory.

3 Claims, 5 Drawing Sheets

(51) Int. Cl.
*B23K 26/08* (2014.01)
*B23K 26/046* (2014.01)
*B23K 101/40* (2006.01)
*B23K 103/00* (2006.01)

LASER PROCESSING METHOD

BACKGROUND OF THE INVENTION

Field of the Invention

The present invention relates to a laser processing method capable of performing laser processing to a wafer as properly measuring the height of the wafer.

Description of the Related Art

A plurality of devices such as integrated circuits (ICs) and large scale integrations (LSIs) are formed on the front side of a wafer so as to be separated by a plurality of division lines. The wafer thus having the plural devices on the front side is divided into individual device chips corresponding to the respective plural devices by using a processing apparatus such as a dicing apparatus and a laser processing apparatus. The device chips thus obtained are used in various electrical equipment such as mobile phones, communications equipment, and personal computers.

The laser processing apparatus includes a chuck table for holding a wafer, laser applying means having focusing means for applying a laser beam to the wafer held on the chuck table, the laser beam having a transmission wavelength to the wafer, in the condition where the focal point of the laser beam is set inside the wafer, thereby forming a modified layer inside the wafer, X moving means for relatively moving the chuck table and the focusing means in an X direction as a feeding direction, Y moving means for relatively moving the chuck table and the focusing means in a Y direction as an indexing direction perpendicular to the X direction, height detecting means for detecting the height of the upper surface of the wafer held on the chuck table, storing means for storing height information on the height of the upper surface of the wafer detected by the height detecting means at a plurality of X coordinates in the X direction, and control means for controlling the chuck table, the laser applying means, the X moving means, the Y moving means, the height detecting means, and the storing means, whereby each division line is processed by the laser beam to form the modified layer as a division start point along each division line (see JP-A-2007-152355, for example).

According to the laser processing method described in JP-A-2007-152355, the height of an area corresponding to each division line is previously detected by the height detecting means for detecting the height of the upper surface of the wafer, and the height information on this height detected is previously stored by the storing means. Further, the focusing means is vertically moved according to the height information stored above to thereby adjust the focal point of the laser beam to a proper vertical position inside the wafer in applying the laser beam along each division line, thus performing desired laser processing.

In the case of generally assuming that the height of the upper surface of a wafer in a work area thereof is detected and stored and the work area is next processed according to the height information stored, it is actually difficult in many cases to measure the height of the upper surface of the wafer in all the work areas thereof and then store the height information in all the work areas because a memory area included in the control means is limited in capacity. Accordingly, to economize on the usage of the memory area for storing the height information, a part of the work areas is selected. For example, one of plural division lines of all the division lines formed on the wafer is selected. In this case, the height of the upper surface of the wafer is measured along this selected division line in one direction (e.g., in a forward direction) by using the height detecting means, and the height information detected above is stored as a representative value. In performing the laser processing to the wafer, this representative value is applied not only to the selected division line along which the height measurement has been made, but also to another near division line along which the height measurement has not been made. Thus, by using this representative value, the focal position of the laser beam for processing the wafer is vertically adjusted along each division line.

SUMMARY OF THE INVENTION

However, in the above case that the height information along a part of the division lines is detected as a representative value and that the focal point of the laser beam is vertically adjusted to a predetermined position inside the wafer according to the height information detected above in performing the laser processing, there arises a problem such that the adjustment of the focal point of the laser beam may become inaccurate to result in inaccurate laser processing. Further, to improve the processing efficiency, there is a case that the laser beam is applied to the wafer during the movement of the chuck table holding the wafer both in the forward direction and in the backward direction. In this case, the height information is detected by scanning measuring light in one direction (e.g., in the forward direction), and the laser processing is performed according to the height information detected above. Accordingly, there is a case that the focusing means may not accurately follow the height information detected above. As a result, there arises a problem that the focal point cannot be vertically adjusted to a proper position and that the laser processing cannot therefore be performed with high accuracy.

The present applicant has examined this problem in detail to find out the following causes. In detecting the height of the upper surface of the wafer in the prior art, the height of the upper surface of the wafer is measured as moving the chuck table holding the wafer in one direction, e.g., along the forward path in the X direction, so as to make uniform the measurement conditions along each division line. Then, the height measured above is stored at a plurality of X coordinates in the X direction. Further, this height measured and stored is used in vertically adjusting the focal position of the laser beam not only along the division line where the height has been measured, but also along another adjacent division line where the height has not been measured. There is a minute hysteresis error in the moving means for moving the chuck table between in the case of moving the chuck table in one direction and in the case of moving the chuck table in the other direction opposite to this one direction. Accordingly, when the chuck table is moved in the other direction opposite to the one direction of measuring the height, a deviation in travel of the chuck table in the X direction corresponding to the hysteresis error is produced with respect to the case where the chuck table is moved in the one direction. As a result, the focal point of the laser beam cannot be vertically adjusted to a proper position along each division line, so that the laser processing cannot be performed with high accuracy.

It is therefore an object of the present invention to provide a laser processing method which can perform laser processing to a wafer with high accuracy according to the height information on the height of the wafer as measured.

In accordance with an aspect of the present invention, there is provided a laser processing method to be performed by a laser processing apparatus including a chuck table for holding a wafer, laser applying means having focusing means for applying a laser beam to the wafer held on the chuck table, the laser beam having a transmission wavelength to the wafer, in the condition where the focal point of the laser beam is set inside the wafer, thereby forming a processed portion inside the wafer, X moving means for relatively moving the chuck table and the focusing means in an X direction as a feeding direction, Y moving means for relatively moving the chuck table and the focusing means in a Y direction as an indexing direction perpendicular to the X direction, height detecting means for detecting the height of the upper surface of the wafer held on the chuck table, storing means for storing height information on the height of the upper surface of the wafer detected by the height detecting means at a plurality of X coordinates in the X direction, and control means for controlling the chuck table, the laser applying means, the X moving means, the Y moving means, the height detecting means, and the storing means. The laser processing method includes: a forward path height storing step of positioning the height detecting means in a forward work area of the wafer where the laser beam is to be applied, relatively moving the chuck table and the height detecting means along a forward path in the X direction, detecting the height of the upper surface of the wafer along the forward path by using the height detecting means, and storing the height information at the X coordinates on the forward path into the storing means; a backward path height storing step of positioning the height detecting means in a backward work area of the wafer where the laser beam is to be applied, the backward area being adjacent to the forward work area, relatively moving the chuck table and the height detecting means along a backward path in the X direction, detecting the height of the upper surface of the wafer along the backward path by using the height detecting means, and storing the height information at the X coordinates on the backward path into the storing means; a forward path processing step of positioning the focusing means in the forward work area, setting the focal point of the laser beam inside the wafer in the forward work area, applying the laser beam to the wafer as vertically moving the focusing means according to the height information stored in the forward path height storing step, and relatively moving the chuck table and the focusing means along the forward path in the X direction; and a backward path processing step of positioning the focusing means in the backward work area, setting the focal point of the laser beam inside the wafer in the backward work area, applying the laser beam to the wafer as vertically moving the focusing means according to the height information stored in the backward path height storing step, and relatively moving the chuck table and the focusing means along the backward path in the X direction; the forward path height storing step, the backward path height storing step, the forward path processing step, and the backward path processing step being repeated to process the wafer.

According to the laser processing method of the present invention, the forward path height storing step, the backward path height storing step, the forward path processing step, and the backward path processing step are repeatedly performed in this order as described above. Accordingly, the direction of movement of the chuck table in detecting the height of the upper surface of the wafer is the same as the direction of movement of the chuck table in performing the laser processing. As a result, a hysteresis error can be removed. Further, the focusing means can be vertically moved to vertically adjust the focal position of the laser beam inside the wafer according to the height information on the height of the upper surface of the wafer. Accordingly, in efficiently performing the laser processing both on the forward path and on the backward path, the focal point of the laser beam can be properly positioned inside the wafer according to the height information previously measured and stored.

The above and other objects, features and advantages of the present invention and the manner of realizing them will become more apparent, and the invention itself will best be understood from a study of the following description and appended claim with reference to the attached drawings showing a preferred embodiment of the invention.

DETAILED DESCRIPTION OF THE PREFERRED EMBODIMENT

A preferred embodiment of the laser processing method according to the present invention will now be described in detail with reference to the attached drawings.

Figure 1:
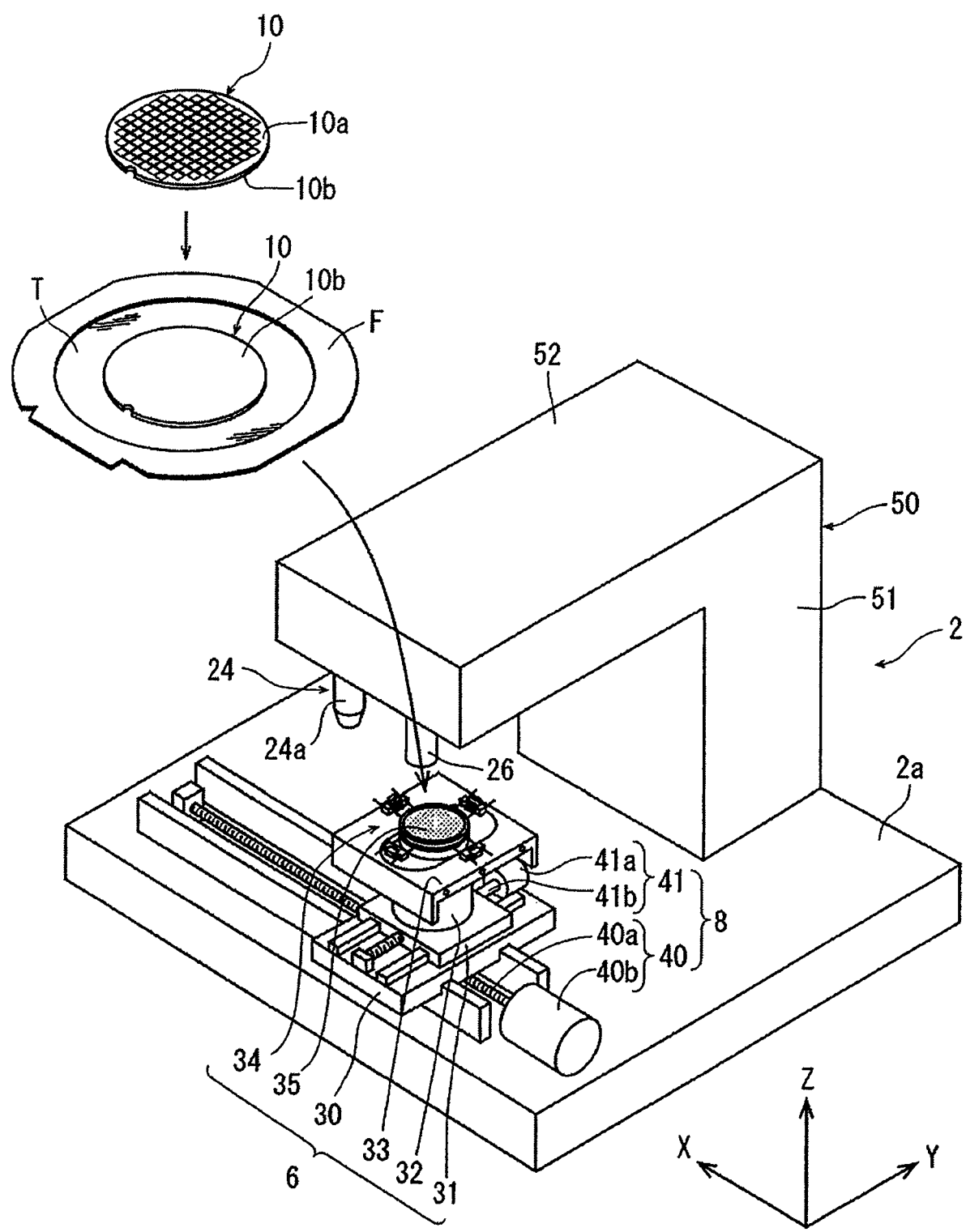
FIG. 1 is a perspective view of a laser processing apparatus.

Referring to FIG. 1, there is depicted a perspective view of a laser processing apparatus 2 to be suitably used in performing the laser processing method according to this preferred embodiment. There is also depicted in FIG. 1 an enlarged perspective view of a wafer 10 as a workpiece to be processed by the laser processing apparatus 2. The laser processing apparatus 2 depicted in FIG. 1 includes a stationary base 2a, holding means 6 for holding the wafer 10, moving means 8 provided on the stationary base 2a for moving the holding means 6, laser applying means 24 for applying a laser beam to the wafer 10 held by the holding means 6, and an L-shaped casing 50 provided on the stationary base 2a at its rear end portion. The L-shaped casing 50 is composed of a vertical portion 51 extending upward from the upper surface of the stationary base 2a at its rear end portion behind the moving means 8 and a horizontal portion 52 extending from the upper end of the vertical portion 51 in a horizontal direction toward a position above the moving means 8. The laser applying means 24 includes an optical system built in the horizontal portion 52 of the casing 50 and focusing means 24a provided on the lower surface of the horizontal portion 52 at its front end portion. The laser processing apparatus 2 further includes imaging means 26 provided on the lower surface of the horizontal portion 52 of the casing 50 at a position adjacent to the focusing means 24a so as to be spaced therefrom in the X direction depicted by an arrow X in FIG. 1. The imaging means 26 is adapted to apply infrared light capable of passing through the workpiece held by the holding means 6, thereby detecting devices and division lines formed on the lower surface of the workpiece held by the holding means 6. As depicted in FIG. 1, the wafer 10 is previously supported through a protective tape T to an annular frame F. The wafer 10 has a front side 10a and a back side 10b opposite to the front side 10a. In this preferred embodiment, the wafer 10 is supported through the protective tape T to the annular frame F in the condition where the back side 10b of the wafer 10 is oriented upward. That is, the front side 10a of the wafer 10 is attached to the protective tape T. Further, the wafer 10 thus supported through the protective tape T to the annular frame F is held through the protective tape T under suction by the holding means 6 in the condition where the back side 10b of the wafer 10 is oriented upward.

The holding means 6 includes a rectangular X movable plate 30 mounted on the base 2a so as to be movable in the X direction, a rectangular Y movable plate 31 mounted on the X movable plate 30 so as to be movable in the Y direction depicted by an arrow Y in FIG. 1, a cylindrical support 32 fixed to the upper surface of the Y movable plate 31, and a rectangular cover plate 33 fixed to the upper end of the support 32. The cover plate 33 is provided with a bellows member (not depicted) extending in the X direction for covering the holding means 6 and the moving means 8. The cover plate 33 has an elongated hole extending in the Y direction. A cylindrical chuck table 34 is rotatably supported to the support 32 so as to extend upward through the elongated hole of the cover plate 33. The chuck table 34 functions to hold the circular wafer 10 as a workpiece thereon. The chuck table 34 is rotatable about its vertical axis by rotational drive means (not depicted) provided in the support 32. The chuck table 34 has an upper surface on which a circular vacuum chuck 35 is provided. The vacuum chuck 35 is formed of a porous material and it has a substantially horizontal holding surface for holding the wafer 10 under suction. The vacuum chuck 35 is connected through a suction line (not depicted) to suction means (not depicted) for supplying a vacuum, the suction line being formed so as to pass through the support 32. The X direction is defined as the direction depicted by the arrow X in FIG. 1, and the Y direction is defined as the direction depicted by the arrow Y in FIG. 1, which is perpendicular to the X direction in an XY plane. The XY plane defined by the X direction and the Y direction is a substantially horizontal plane.

The moving means 8 includes X moving means 40 for moving the X movable plate 30 in the X direction and Y moving means 41 for moving the Y movable plate 31 in the Y direction. The X moving means 40 includes a ball screw 40a extending in the X direction and a motor 40b for rotating the ball screw 40a. The ball screw 40a is operatively connected to the X movable plate 30. The moving means 40 is operated in such a manner that the rotary motion of the motor 40b is converted into a linear motion by the ball screw 40a and the linear motion is transmitted to the X movable plate 30, so that the X movable plate 30 is moved in the X direction along a pair of guide rails provided on the base 2a. Similarly, the Y moving means 41 includes a ball screw 41a extending in the Y direction and a motor 41b for rotating the ball screw 41a. The ball screw 41a is operatively connected to the Y movable plate 31. The Y moving means 41 is operated in such a manner that the rotary motion of the motor 41b is converted into a linear motion by the ball screw 41a and this linear motion is transmitted to the Y movable plate 31, so that the Y movable plate 31 is moved in the Y direction along a pair of guide rails provided on the X movable plate 30. Although not depicted, the X moving means 40, the Y moving means 41, and the rotational drive means are each provided with position detecting means. The position detecting means in the X moving means 40 functions to accurately detect the X position of the chuck table 34. The position detecting means in the Y moving means 41 functions to accurately detect the Y position of the chuck table 34. The position detecting means in the rotational drive means functions to accurately detect the rotational position of the chuck table 34. Detection signals from these position detecting means are transmitted to control means (not depicted). According to control signals output from the control means, the X moving means 40, the Y moving means 41, and the rotational drive means can be all driven to accurately move the chuck table 34 to an arbitrary position and accurately rotate the chuck table 34 at an arbitrary angle.

Figure 2:
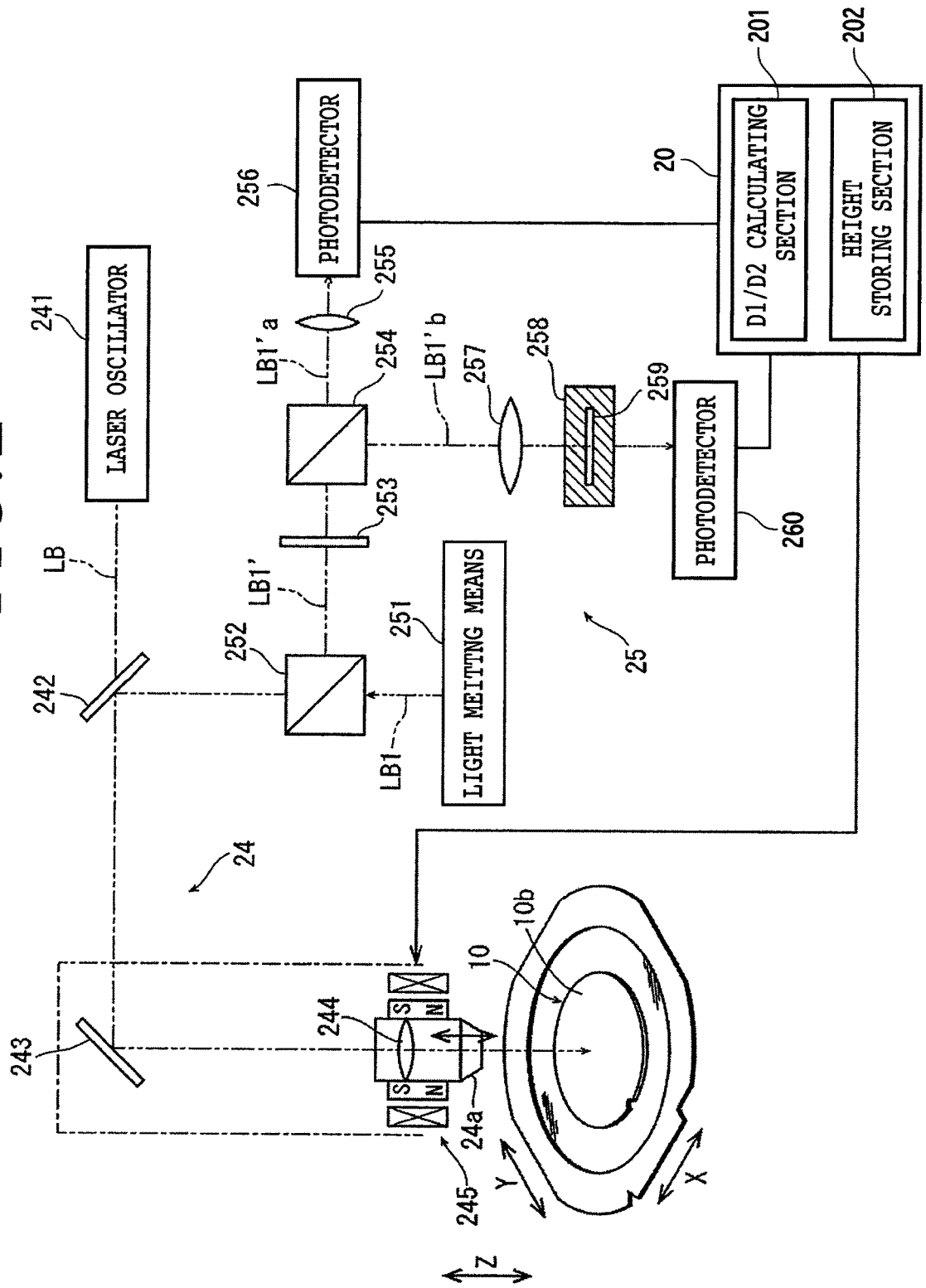
FIG. 2 is a block diagram for illustrating laser applying means included in the laser processing apparatus depicted in FIG. 1.

The laser applying means 24 of the laser processing apparatus 2 will now be described more specifically with reference to FIG. 2. As depicted in FIG. 2, the laser applying means 24 includes a laser oscillator 241 for oscillating a laser beam LB having a transmission wavelength (e.g., 1064 nm) to the wafer 10 formed of silicon (Si). The laser beam LB is a processing laser beam for processing the wafer 10. The laser beam LB oscillated from the laser oscillator 241 is sent to the focusing means 24a and then applied from the focusing means 24a to the wafer 10. On an optical path of the laser beam LB oscillated from the laser oscillator 241, there is provided a dichroic mirror 242 for reflecting light having a wavelength of 600 to 800 nm including the wavelength of visible light and transmitting light in the other wavelength regions. Further, a reflecting mirror 243 is provided on an optical path of the laser beam LB transmitted through the dichroic mirror 242. The traveling direction of the laser beam LB is changed by the reflecting mirror 243 to reach the focusing means 24a. The focusing means 24a includes a focusing lens 244 for focusing the laser beam LB reflected by the reflecting mirror 243 and then applying the laser beam LB to the wafer 10 held on the chuck table 34. As depicted in FIG. 2, the focusing means 24a is provided with a so-called voice coil motor 245 composed of a magnet and a coil. The voice coil motor 245 functions to vertically move the focusing lens 244 in a direction perpendicular to the holding surface for holding the wafer 10, i.e., in a focal position adjusting direction, by receiving a control signal from control means 20. That is, the voice coil motor 245 is operated according to the control signal from the control means 20 to thereby move the focusing lens 244 in the focal position adjusting direction to a desired position. This focal position adjusting direction is defined as the Z direction depicted by an arrow Z in FIG. 2.

Figures 3A, 3B:
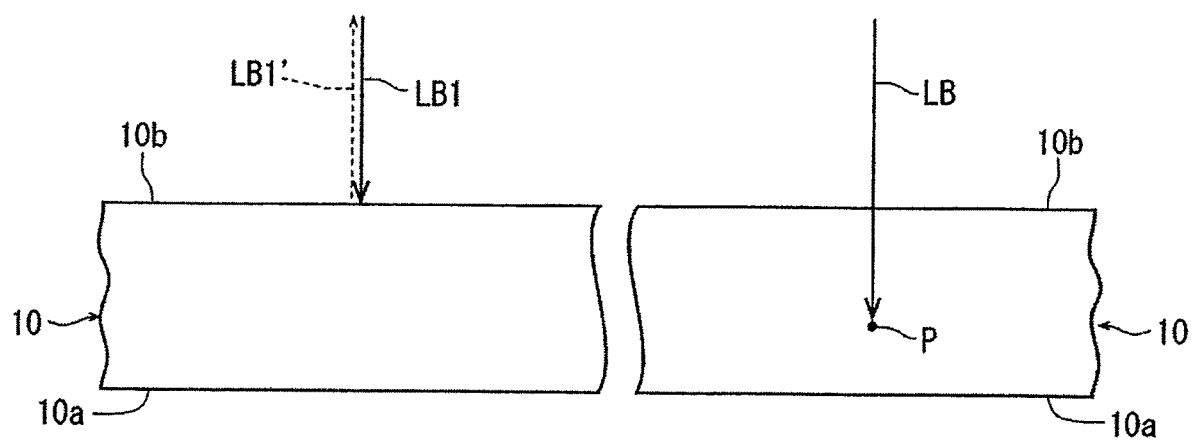
FIG. 3A is an enlarged sectional view of an essential part of a wafer in detecting the height of the upper surface of the wafer.
FIG. 3B is a view similar to FIG. 3A, in performing laser processing to the wafer.

As depicted in FIG. 2, the laser applying means 24 is provided with height detecting means 25 for performing a height measuring step of measuring and storing the height of the upper surface of the wafer 10 held on the chuck table 34. The height detecting means 25 includes light emitting means 251 for emitting measuring light LB1 as visible light having a wavelength of 700 nm and a first beam splitter 252 for transmitting the measuring light LB1 emitted from the light emitting means 251 toward the dichroic mirror 242. The measuring light LB1 transmitted through the first beam splitter 252 is reflected by the dichroic mirror 242 and next reflected by the reflecting mirror 243 to impinge on the upper surface of the wafer 10. As depicted in FIG. 3A, the measuring light LB1 applied to the upper surface of the wafer 10 is reflected on the upper surface of the wafer 10 to generate a return light LB1'. The return light LB1' is reflected by the reflecting mirror 243 and next reflected by the dichroic mirror 242 to reach the first beam splitter 252. The return light LB1' is next reflected by the first beam splitter 252. The height detecting means 25 further includes a bandpass filter 253 capable of passing light having a wavelength of 680 to 720 nm, so as to pass only the return light LB1' and a second beam splitter 254 for separating the return light LB1' passed through the bandpass filter 253, at a separation ratio of 1:1 to obtain a transmitted light LB1'$a$ and a reflected light LB1'$b$. The height detecting means 25 further includes a focusing lens 255 for focusing the transmitted light LB1'$a$ transmitted through the second bandpass filter 254 and a photodetector 256 for detecting the light intensity D1 of the transmitted light LB1'$a$ focused by the focusing lens 255 and outputting a voltage signal corresponding to the light intensity D1 detected. The height detecting means 25 further includes a focusing lens 257 for focusing the reflected light LB1'$b$ reflected by the second beam splitter 254, a mask 258 having a slit 259 having a width equal to the spot diameter in the case that the reflected light LB1'$b$ is focused by the focusing lens 257 to form a minimum beam spot, and a photodetector 260 for detecting the light intensity D2 of the reflected light LB1'$b$ passed through the slit 259 of the mask 258 and outputting a voltage signal corresponding to the light intensity D2 detected. The voltage signal indicating the light intensity D1 detected by the photodetector 256 and the voltage signal indicating the light intensity D2 detected by the photodetector 260 are sent to the control means 20. While the slit 259 of the mask 258 is so depicted as to be seen in FIG. 2 for convenience of illustration, the slit 259 is actually formed so as to open to the upper and lower surfaces of the mask 258. There will now be specifically described the principle of measurement of the height of the upper surface of the wafer 10 by the height detecting means 25.

As described above, the measuring light LB1 is visible light having a wavelength of 700 nm. The focal point of this measuring light LB1 in focusing the measuring light LB1 to the wafer 10 by using the focusing lens 244 of the focusing means 24$a$ is set at a reference position above the upper surface of the vacuum chuck 35 of the chuck table 34 by a predetermined distance. For example, when the thickness of the wafer 10 is 200 μm, this predetermined distance is set to 220 μm. That is, the reference position is set so as to be always present above the upper surface of the wafer 10 regardless of variations in the thickness of the wafer 10. Accordingly, the reference position is not changed, but fixed during the measurement of the height of the upper surface of the wafer 10.

The transmitted light LB1'$a$ from the second beam splitter 254 is all focused by the focusing lens 255 and detected by the photodetector 256. That is, 100% of the transmitted light LB1'$a$ is always detected by the photodetector 256. Accordingly, even when the height of the upper surface of the wafer 10 changes to cause a change in reflection position of the measuring light LB1 on the upper surface of the wafer 10, the light intensity D1 output from the photodetector 256 becomes constant as far as the light quantity of the measuring light LB1 to be emitted from the light emitting means 251 is fixed.

On the other hand, the reflected light LB1'$b$ from the second beam splitter 254 is sent through the mask 258 having the slit 259 to the photodetector 260, so that the light intensity D2 output from the photodetector 260 changes with a change in height of the upper surface of the wafer 10. That is, when the height of the upper surface of the wafer 10 changes, the size of the spot of the measuring light LB1 to be formed on the upper surface of the wafer 10 also changes. More specifically, when the height of the upper surface of the wafer 10 is increased, the upper surface of the wafer 10 approaches the reference position where the focal point of the measuring light LB1 is set. Accordingly, the spot size of the measuring light LB1 on the upper surface of the wafer 10 is decreased upon reflection on the upper surface of the wafer 10. Accordingly, the cross-sectional area of the beam of the return light LB1' is decreased, and the spot size of the beam of the reflected light LB1'$b$ focused by the focusing lens 257 and next reached the mask 258 is also decreased. Accordingly, the proportion of the reflected light LB1'$b$ that can be passed through the slit 259 is increased. Thus, when the height of the upper surface of the wafer 10 is increased, the amount of the reflected light LB1'$b$ passing through the slit 259 is increased, so that the light intensity D2 to be detected by the photodetector 260 is increased. Conversely, when the height of the upper surface of the wafer 10 is decreased, the light intensity D2 is decreased.

As described above, the light intensity D1 to be detected by the photodetector 256 is constant regardless of variations in height of the upper surface of the wafer 10. Accordingly, the ratio D1/D2 between the light intensity D1 and the light intensity D2 changes with a change in height of the upper surface of the wafer 10. It is understood that the more the ratio D1/D2 approaches 1, the higher in level the upper surface of the wafer 10, that is, the more the upper surface of the wafer 10 approaches the reference position. Conversely, it is also understood that the greater the ratio D1/D2, the lower in level the upper surface of the wafer 10, i.e., the more the upper surface of the wafer 10 moves away from the reference position. Accordingly, by previously conducting an experiment to determine the distance from the reference position to the upper surface of the wafer 10 as corresponding to the light intensity ratio D1/D2 and then prepare a map indicating the correspondence between this distance from the reference position and the light intensity ratio D1/D2, the height of the upper surface of the wafer 10 can be easily calculated from the light intensity ratio D1/D2.

The control means 20 is configured by a computer, which includes a central processing unit (CPU) for computing according to a control program, a read only memory (ROM) previously storing the control program, a random access memory (RAM) for temporarily storing detection values, operation results, etc., an input interface, and an output interface (the details of these components are not depicted). The control means 20 includes a D1/D2 calculating section 201 for calculating the light intensity ratio D1/D2 according to the light intensity D1 detected by the photodetector 256 and the light intensity D2 detected by the photodetector 260, a map (see FIG. 5) for use in determining the height of the upper surface of the wafer 10 according to the light intensity ratio D1/D2 calculated above, and a height storing section 202 for storing the height of the upper surface of the wafer 10 determined above by using the map, at a plurality of coordinate positions where the measuring light LB1 is applied.

There will now be described in detail the control and the wafer processing method to be performed by the laser processing apparatus 2 as configured above.

The wafer 10 as a workpiece depicted in FIG. 1 is a circular member formed of silicon (Si) and has a thickness of 200 µm, for example. A plurality of crossing division lines are previously formed on the front side 10a of the wafer 10 to thereby define a plurality of separate regions where a plurality of devices are formed. Each division line is a work area to be processed. The plural devices are previously formed on the front side 10a of the wafer 10 so as to be separated from each other by the plural division lines. As depicted in FIG. 1, the wafer 10 supported through the protective tape T to the annular frame F is held on the chuck table 34. The front side 10a of the wafer 10 is attached to the protective tape T, and the back side 10b of the wafer 10 is oriented upward in the supported condition of the wafer 10 by the protective tape T. Accordingly, "the upper surface" of the wafer 10 mentioned in this preferred embodiment is defined as the back side 10b of the wafer 10.

The wafer 10 is laser-processed by performing the laser processing method using the laser processing apparatus 2 in the following manner.

The wafer 10 supported through the protective tape T to the annular frame F as mentioned above is loaded to the laser processing apparatus 2 and then placed on the chuck table 34 in the condition where the back side 10b of the wafer 10 is oriented upward. Thereafter, the suction means is operated to hold the wafer 10 through the protective tape T on the chuck table 34 under suction. Thereafter, the moving means 8 is operated to move the chuck table 34 to the position directly below the imaging means 26 capable of imaging the division lines by applying infrared light passing through the wafer 10. When the wafer 10 held on the chuck table 34 is positioned directly below the imaging means 26, image processing such as pattern matching is performed to thereby align the focusing means 24a with any one of the division lines as a work position on the wafer 10. The result of this alignment is transmitted to the control means 20 and then stored in the control means 20.

Figure 4B:
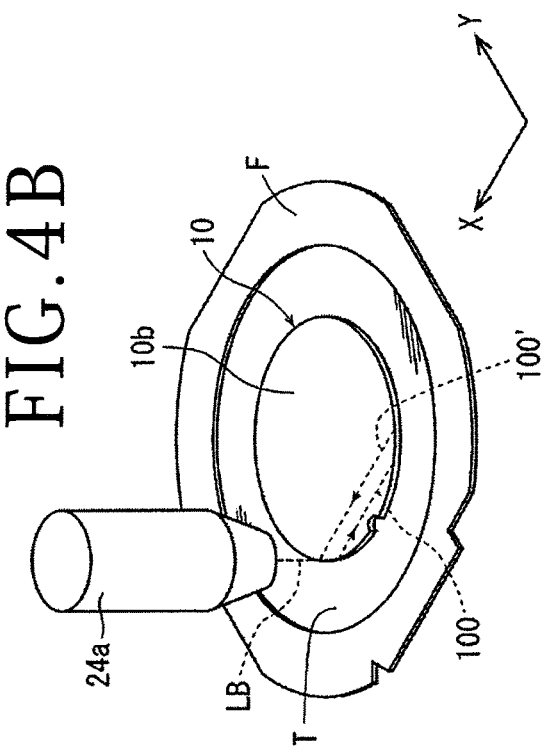
FIG. 4B is a perspective view for illustrating a forward path processing step and a backward path processing step.
Figure 4D:
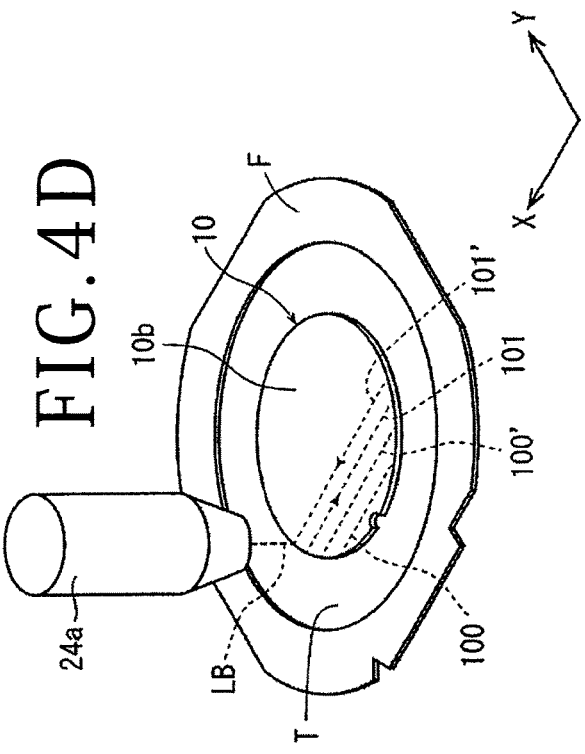
FIGS. 4C and 4D are views respectively similar to FIGS. 4A and 4B, depicting the steps following the steps depicted in FIGS. 4A and 4B.
Figure 4A:
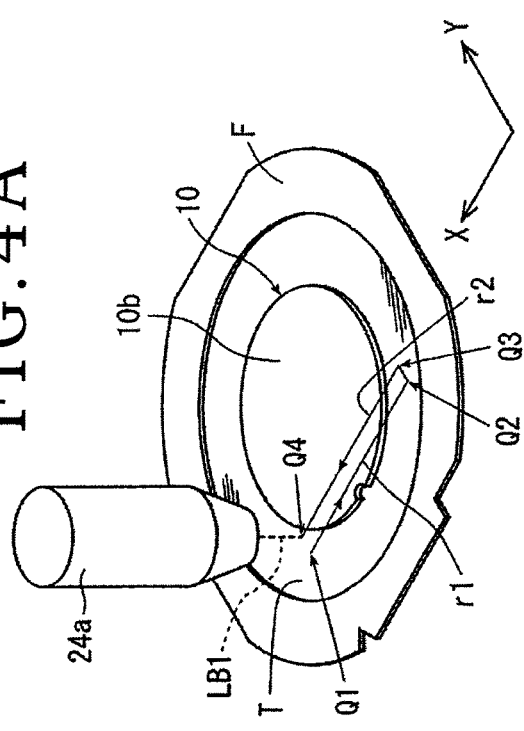
FIG. 4A is a perspective view for illustrating a forward path height storing step and a backward path height storing step.

After performing this alignment, the chuck table 34 is moved to set a height measurement start position Q1 on a forward path r1 depicted in FIG. 4A directly below the focusing means 24a. The forward path r1 corresponds to a target one of the division lines. The focal point of the measuring light LB1 to be focused by the focusing means 24a in operating the height detecting means 25 is first set at a position above the upper surface of the vacuum chuck 35 by 220 µm. This position is the reference position to be used in measuring the height of the upper surface of the wafer 10. Thereafter, the measuring light LB1 is applied from the focusing means 24a to the wafer 10, and at the same time the X moving means 40 is operated to move the chuck table 34 in the X direction. At this time, the chuck table 34 is moved in the X direction so that the measuring light LB1 applied from the focusing means 24a is moved (scanned) in the direction depicted by an arrow on the forward path r1 depicted in FIG. 4A. Thus, the position of application of the measuring light LB1 is moved from the measurement start position Q1 to a measurement end position Q2 depicted in FIG. 4A. During this movement, a plurality of values for the light intensity D1 corresponding to a plurality of X coordinates (Xm) at predetermined positions on the forward path r1 are output from the photodetector 256 to the control means 20. Similarly, a plurality of values for the light intensity D2 corresponding to the plural X coordinates (Xm) at the predetermined positions on the forward path r1 are output from the photodetector 260 to the control means 20. Then, the light intensity ratio D1/D2 is calculated in the D1/D2 calculating section 201 of the control means 20.

Figure 5:
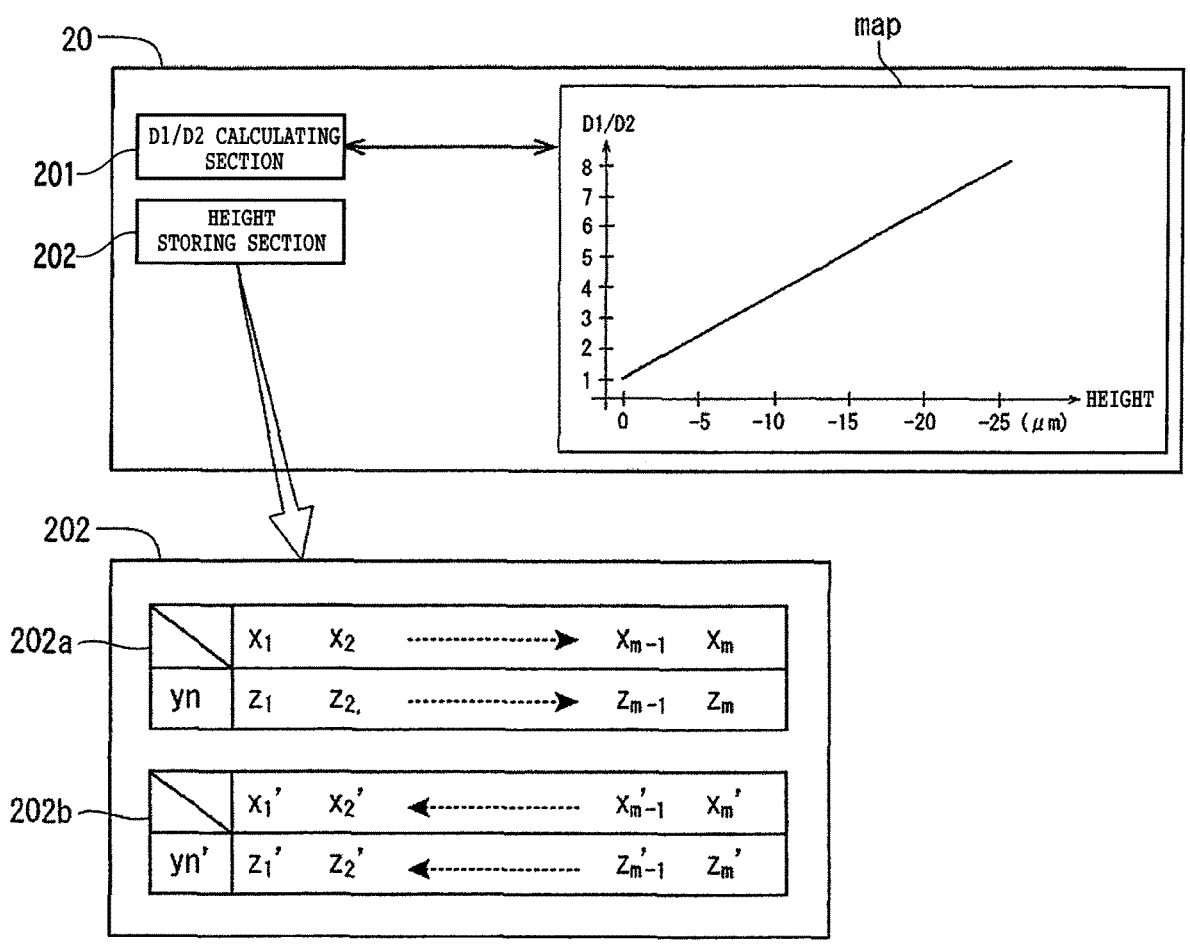
FIG. 5 is a block diagram for illustrating a method of computing height information in control means included in the laser processing apparatus depicted in FIG. 1.

After calculating the light intensity ratio D1/D2 it each predetermined position (i.e., at each X coordinate) on the forward path r1, the map stored in the control means 20 as depicted in FIG. 5 is referred to, thereby detecting the height of the upper surface of the wafer 10 with respect to the reference position at the plural X coordinates (X1 to Xm). For example, when the height of the upper surface of the wafer 10 with respect to the reference position at a predetermined one of the X coordinates (X1 to Xm) is detected as −19 µm from the map, this value of −19 µm is added to 220 µm as the height of the reference position to thereby calculate an actual value (=220 µm−19 µm=201 µm) for the height of the upper surface of the wafer 10. Then, this actual value calculated above at the predetermined X coordinate on the forward path r1 is stored into a forward path height storing section 202a as a part of the height storing section 202 formed in the RAM of the control means 20. In this manner, the heights (Z1 to Zm) of the upper surface of the wafer 10 at all the predetermined positions (X1 to Xm) on the forward path r1 are sequentially measured by the height detecting means 25 and stored into the forward path height storing section 202a of the control means 20 (see FIG. 5). Thusly, a forward path height storing step is performed.

After performing the forward path height storing step, the Y moving means 41 is operated to move the chuck table 34 in the Y direction, thereby indexing the chuck table 34 relative to the focusing means 24a. That is, the chuck table 34 is moved in the Y direction so that a height measurement start position Q3 on a backward path r2 (see FIG. 4A) corresponding to the next work area (the next division line) is set directly below the focusing means 24a.

After indexing the chuck table 34 as mentioned above, the focal point of the measuring light LB1 is set in a manner similar to that in the forward path height storing step. That is, the focal point of the measuring light LB1 is set at a position above the upper surface of the vacuum chuck 35 by 220 µm. This position is the reference position to be used in measuring the height of the upper surface of the wafer 10. Thereafter, the measuring light LB1 is applied from the focusing means 24a to the wafer 10, and at the same time the X moving means 40 is operated to move the chuck table 34 in the X direction. At this time, it is important that the direction of movement of the chuck table 34 is opposite to the direction of movement of the chuck table 34 in the forward path height storing step mentioned above. That is, the chuck table 34 is moved in the X direction so that the measuring light LB1 applied from the focusing means 24a is moved (scanned) in the direction depicted by an arrow on the backward path r2 depicted in FIG. 4A. Thus, the position of application of the measuring light LB1 is moved from the measurement start position Q3 to a measurement end position Q4 depicted in FIG. 4A. As a result, the light intensity D1 corresponding to each X coordinate on the backward path r2 is output from the photodetector 256 to the control means 20, and the light intensity D2 corresponding to each X coordinate on the backward path r2 is output from the photodetector 260 to the control means 20. Then, the light intensity ratio D1/D2 is calculated in the D1/D2 calculating section 201 of the control means 20.

After calculating the light intensity ratio D1/D2 at each X coordinate on the backward path r2, the map depicted in FIG. 5 is referred to, thereby detecting the height of the upper surface of the wafer 10 with respect to the reference position at each X coordinate position. A method of calculating an actual value for the height of the upper surface of the wafer 10 on the backward path r2 is similar to the method performed in the forward path height storing step, so that the description of the method for the backward path r2 will be omitted herein. In this manner, the heights (Zm' to Z1') of the upper surface of the wafer 10 at all the X coordinates (Xm' to X1') on the backward path r2 are sequentially measured by the height detecting means 25 and stored into a backward path height storing section 202b as a part of the height storing section 202 formed in the RAM of the control means 20 as depicted in FIG. 5. Thusly, a backward path height storing step is performed.

In this manner, the heights (Z1 to Zm) of the upper surface of the wafer 10 at the predetermined X coordinates (X1 to Xm) on the forward path r1 and the heights (Z1' to Zm') of the upper surface of the wafer 10 at the predetermined X coordinates (X1' to Xm') on the backward path r2 are sequentially measured by moving the chuck table 34 in opposite directions and then stored into the forward path height storing section 202a and the backward path height storing section 202b, respectively, these storing sections 202a and 202b constituting the height storing section 202 in the control means 20.

In storing the information on the height of the upper surface of the wafer 10 at each X coordinate on the forward path r1 and the backward path r2, a Y coordinate (Yn) of the forward path r1 and a Y coordinate (Yn') of the backward path r2 may also be stored into the height storing section 202 as depicted in FIG. 5.

As described above, the forward path height storing step is performed along the forward path r1 as a work area of the wafer 10, and the backward path height storing step is performed along the backward path r2 adjacent to the forward path r1 as another work area of the wafer 10. Thereafter, the focal point of the processing laser beam LB is set inside the wafer 10 to perform a forward path processing step and a backward path processing step. More specifically, as depicted in FIG. 4B, the forward path processing step is performed by applying the processing laser beam LB along a work area 100 corresponding to the forward path r1 to thereby form a modified layer inside the wafer 10 along the work area 100. After performing the forward path processing step, the backward path processing step is performed by applying the processing laser beam LB along a work area 100' corresponding to the backward path r2 to thereby form a modified layer inside the wafer 10 along the work area 100'.

In the forward path processing step, the processing laser beam LB is applied according to the height information stored in the forward path height storing step. Similarly, in the backward path processing step, the processing laser beam LB is applied according to the height information stored in the backward path height storing step. More specifically, one end of the work area 100 depicted by a broken line in FIG. 4B is positioned directly below the focusing means 24a. Further, the focal point of the processing laser beam LB is set at a predetermined position P (see FIG. 3B) inside the wafer 10. Thereafter, the chuck table 34 is moved in the X direction by operating the X moving means 40 so that the laser processing is performed in the direction depicted by an arrow along the work area 100. In applying the processing laser beam LB along the work area 100, the voice coil motor 245 is controlled according to the information on the height of the upper surface of the wafer 10 as previously stored in the forward path height storing section 202a, thereby vertically adjusting the focal position P. Accordingly, the focal position P can be always accurately adjusted to a fixed position inside the wafer 10 in applying the processing laser beam LB. That is, the modified layer can be formed at a fixed distance from the upper surface of the wafer 10, i.e., at a fixed depth from the upper surface of the wafer 10 in parallel thereto. In this manner, the laser processing is performed along the work area 100 until the modified layer reaches the other end of the work area 100 as depicted in FIG. 4B. Thus, the forward path processing step along the work area 100 is finished.

After performing the forward path processing step, the Y moving means 41 is operated to move the chuck table 34 in the Y direction so that the focusing means 24a is indexed to the next work area 100'. A processing start position in the work area 100' is set adjacent to the other end of the work area 100. That is, the processing start position is set at the edge of the wafer 100 near the height measurement start position Q3 set in the backward path height storing step depicted in FIG. 4A. Thereafter, the X moving means 40 is operated to move the chuck table 34 in the direction opposite to the direction of movement of the chuck table 34 in the forward path processing step. During this movement of the chuck table 34, the processing laser beam LB is applied to the work area 100' so as to be scanned from one end near the measurement start position Q3 to the other end near the measurement end position Q4, thereby forming a modified layer inside the wafer 10 along the work area 100'. In applying the processing laser beam LB along the work area 100', the voice coil motor 245 is controlled according to the information on the height of the upper surface of the wafer 10 as previously stored in the backward path height storing section 202b, thereby vertically adjusting the focal position P. Accordingly, the focal position P can be always accurately adjusted to a fixed position inside the wafer 10 in applying the processing laser beam LB. That is, the modified layer can be formed at a fixed depth from the upper surface of the wafer 10 in parallel thereto. Thus, the backward path processing step along the work area 100' is finished. The direction of movement of the chuck table 34 in the forward path processing step is the same as the direction of movement of the chuck table 34 in the forward path height storing step. Further, the direction of movement of the chuck table 34 in the backward path processing step is the same as the direction of movement of the chuck table 34 in the backward path height storing step.

For example, the forward path processing step and the backward path processing step may be performed under the following laser processing conditions.

Figure 4C:
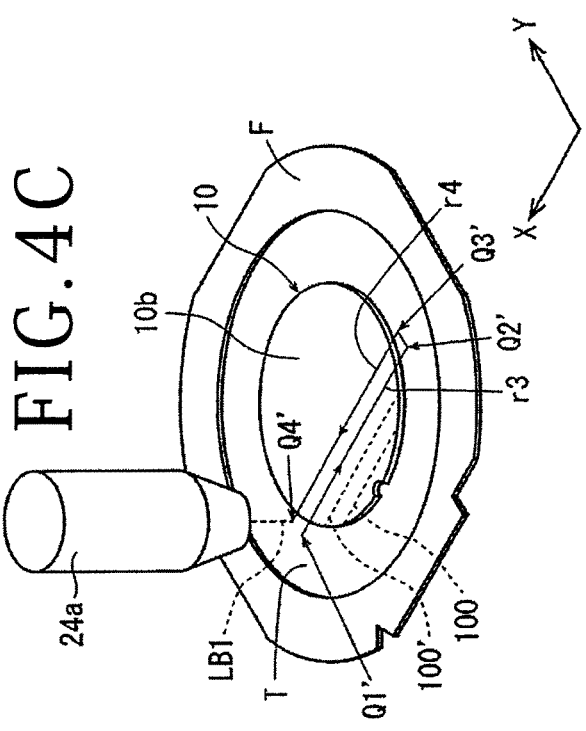

Wavelength: 1064 nm
Repetition frequency: 50 kHz
Average power: 0.5 W
Feed speed: 200 mm/second After performing the forward path height storing step and the backward path height storing step and then performing the forward path processing step and the backward path processing step to thereby form a modified layer along the work area 100 and also form a modified layer along the work area 100', the height information on the forward path r1 and the backward path r2 as stored in the height storing section 202 of the control means 20 is reset (cleared). Thereafter, a forward path height storing step is similarly performed along a forward path r3 adjacent to the work area 100' as depicted in FIG. 4C, and a backward path height storing step is next similarly performed along a backward path r4 adjacent to the forward path r3 as depicted in FIG. 4C. In the forward path height storing step along the forward path r3, the chuck table 34 is moved so that a height measurement start position Q1' on the forward path r3 is set directly below the focusing means 24a. Thereafter, the measuring light LB1 is applied in such a manner that the position of application of the measuring light LB1 is moved from the measurement start position Q1' to a measurement end position Q2' by operating the X moving means 40. Thereafter, the Y moving means 41 is operated to index the focusing means 24a in the Y direction. In the backward path height storing step along the backward path r4, the chuck table 34 is moved so that a measurement start position Q3' on the backward path r4 is set directly below the focusing means 24a. Thereafter, the measuring light LB1 is applied in such a manner that the position of application of the measuring light LB1 is moved from the measurement start position Q3' to a measurement end position Q4' by operating the X moving means 40. Thus, the height information on the forward path r3 and the backward path r4 is stored into the height storing section 202. Thereafter, a forward path processing step is similarly performed along a work area 101 corresponding to the forward path r3, and a backward path processing step is next similarly performed along a work area 101' corresponding to the backward path r4 as depicted in FIG. 4D. The forward path processing step along the work area 101 is performed in a manner similar to that in the forward path processing step along the work area 100 mentioned above, and the backward path processing step along the work area 101' is performed in a manner similar to that in the backward path processing step along the work area 100'. In this manner, the forward path height storing step, the backward path height storing step, the forward path processing step, and the backward path processing step are repeated in this order to thereby form a plurality of modified layers inside the wafer 10 along all the work areas (all the division lines) set on the wafer 10.

According to this preferred embodiment, the direction of movement of the chuck table 34 in performing the forward path height storing step is opposite to the direction of movement of the chuck table 34 in performing the backward path height storing step. Further, the direction of movement of the chuck table 34 in performing the forward path processing step to form a modified layer along the work area 100 corresponding to the forward path r1 is the same as the direction of movement of the chuck table 34 in performing the forward path height storing step. Similarly, the direction of movement of the chuck table 34 in performing the backward path processing step to form a modified layer along the work area 100' corresponding to the backward path r2 is the same as the direction of movement of the chuck table 34 in performing the backward path height storing step. Further, during the movement of the chuck table 34 in the forward path processing step and in the backward path processing step, the focal position of the processing laser beam LB is vertically adjusted according to the height information stored in the height storing section 202. Accordingly, even in the case of reciprocating the chuck table 34 and applying the laser beam LB to the wafer 10 along the work area to thereby form a modified layer inside the wafer 10, the focusing means 24a can be operated so as to accurately follow the height information, so that the focal point of the laser beam LB can be accurately adjusted to a proper position, thereby realizing high-accuracy processing.

The present invention is not limited to the above preferred embodiment, but various modifications may be made within the scope of the present invention. For example, in this preferred embodiment, the front side 10a of the wafer 10 on which the devices are formed is attached to the protective tape T, and the wafer 10 is supported through the protective tape T to the annular frame F. Further, in the preferred embodiment, the wafer 10 is held under suction on the chuck table 34 in the condition where the back side 10b of the wafer 10 is oriented upward in detecting the height of the upper surface of the wafer 10 by using the height detecting means 24 and also in applying the laser beam LB to the upper surface of the wafer 10 to form a modified layer inside the wafer 10. As a modification, the back side 10b of the wafer 10 may be attached to the protective tape T, and the wafer 10 may be held on the chuck table 34 in the condition where the front side 10a of the wafer 10 is oriented upward. In this case, the height of the front side 10a of the wafer 10 is measured, and the laser beam LB is also applied to the front side 10a of the wafer 10.

Further, the laser processing in this preferred embodiment is performed to form a modified layer inside the wafer 10 along each division line by applying a laser beam to the wafer 10 in the condition where the focal point of the laser beam is set inside the wafer 10. As a modification, the laser processing in the present invention may be of another type such that a laser beam is applied to the wafer 10 in the condition where the focal point of the laser beam is set inside the wafer 10, thereby forming a plurality of shield tunnels along each division line, each shield tunnel extending from the front side of the wafer 10 to the back side thereof, each shield tunnel being composed of a fine hole and an amorphous region surrounding the fine hole.

The present invention is not limited to the details of the above described preferred embodiment. The scope of the invention is defined by the appended claim and all changes and modifications as fall within the equivalence of the scope of the claim are therefore to be embraced by the invention.

What is claimed is:

1. A laser processing method to be performed by a laser processing apparatus including a chuck table for holding a wafer, laser applying means having focusing means for applying a laser beam to the wafer held on the chuck table, the laser beam having a transmission wavelength to the wafer, in the condition where the focal point of the laser beam is set inside the wafer, thereby forming a processed portion inside the wafer, X moving means for relatively moving the chuck table and the focusing means in an X direction as a feeding direction, Y moving means for relatively moving the chuck table and the focusing means in a Y direction as an indexing direction perpendicular to the X direction, height detecting means for detecting the height of the upper surface of the wafer held on the chuck table, storing means for storing height information on the height of the upper surface of the wafer detected by the height detecting means at a plurality of X coordinates in the X direction, and control means for controlling the chuck table, the laser applying means, the X moving means, the Y moving means, the height detecting means, and the storing means, the laser processing method comprising:

a forward path height storing step of positioning the height detecting means in a forward work area of the wafer where the laser beam is to be applied, relatively moving the chuck table and the height detecting means along a forward path in the X direction from the forward work area to a forward measurement end position, detecting the height of the upper surface of the wafer along the forward path from the forward work area to the forward measurement end position by using the height detecting means, and storing the height information at the X coordinates on the forward path into the storing means;

a backward path height storing step of positioning the height detecting means in a backward work area of the wafer where the laser beam is to be applied, the backward work area being near an opposite end of the forward path from forward work area and displaced in the Y direction from the forward measurement end position, relatively moving, from the backward work area, the chuck table and the height detecting means along a backward path in the X direction, parallel to and opposite the X direction of the forward path, while detecting the height of the upper surface of the wafer along the backward path from the backward work area to a backward measurement end position displaced in the Y direction from the forward work area by using the height detecting means, and storing the height information at the X coordinates on the backward path into the storing means;

a forward path processing step of positioning the focusing means in the forward work area, setting the focal point of the laser beam inside the wafer in the forward work area, applying the laser beam to the wafer as vertically moving the focusing means according to the height information stored in the forward path height storing step, and relatively moving the chuck table and the focusing means along the forward path in the X direction; and a backward path processing step of positioning the focusing means in the backward work area, setting the focal point of the laser beam inside the wafer in the backward work area, applying the laser beam to the wafer as vertically moving the focusing means according to the height information stored in the backward path height storing step, and relatively moving the chuck table and the focusing means along the backward path in the X direction, opposite the X direction of the forward path;

the forward path height storing step, the backward path height storing step, the forward path processing step, and the backward path processing step being repeated to process the wafer.

2. The laser processing method as defined in claim 1 wherein the backward path height storing step is performed following the forward path height storing step before another forward path height storing step is performed.

3. The laser processing method as defined in claim 2 wherein the forward path processing step and the backward path processing step are performed following the backward path height storing step before another forward path height storing step or another backward path processing step is performed.

* * * * *